US011012081B2

(12) United States Patent
Parvizi et al.

(10) Patent No.: US 11,012,081 B2
(45) Date of Patent: *May 18, 2021

(54) APPARATUS AND METHODS FOR DIGITAL PHASE LOCKED LOOP WITH ANALOG PROPORTIONAL CONTROL FUNCTION

(71) Applicant: Ciena Corporation, Hanover, MD (US)

(72) Inventors: Mahdi Parvizi, Kanata (CA); Sadok Aouini, Gatineau (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/927,807

(22) Filed: Jul. 13, 2020

(65) Prior Publication Data

US 2021/0111729 A1    Apr. 15, 2021

Related U.S. Application Data

(63) Continuation of application No. 16/600,808, filed on Oct. 14, 2019, now Pat. No. 10,715,155.

(51) Int. Cl.
*H03L 7/099* (2006.01)
*H03L 7/093* (2006.01)
*H03L 7/089* (2006.01)

(52) U.S. Cl.
CPC ............ *H03L 7/0995* (2013.01); *H03L 7/089* (2013.01); *H03L 7/093* (2013.01)

(58) Field of Classification Search
CPC ........ H03L 7/089; H03L 7/093; H03L 7/0995
See application file for complete search history.

(56) References Cited

U.S. PATENT DOCUMENTS

| | | | |
|---|---|---|---|
| 8,878,614 B2 * | 11/2014 | Yin | H03L 7/099 331/25 |
| 10,320,374 B2 | 6/2019 | Parvizi et al. | |
| 10,355,702 B2 | 7/2019 | Gao et al. | |
| 10,715,155 B1 * | 7/2020 | Parvizi | H03L 7/093 |
| 2013/0027097 A1 | 1/2013 | Wang et al. | |
| 2013/0222067 A1 | 8/2013 | Yin et al. | |
| 2019/0028108 A1 | 1/2019 | Gao et al. | |

* cited by examiner

*Primary Examiner* — Patrick O Neill
(74) *Attorney, Agent, or Firm* — Young Basile Hanlon & MacFarlane, P.C.

(57) ABSTRACT

Described herein is a digital phase locked loop (PLL) which includes a phase frequency detector (PFD) outputting a pulse width modulated (PWM) up pulse and a PWM down pulse based on comparison of a reference clock and a feedback clock, a digital integral circuit connected to the PFD, the digital integral circuit outputting a digital control signal based on the PWM up and down pulses, and a controlled oscillator (CO) connected to the digital integral circuit and an output and input of the PFD. The CO receiving the PWM up and down pulses from the PFD and adjusting a frequency of the CO based on the digital control signal and the PWM up and down pulses to generate an output clock. The feedback clock is based on the output clock and the reference clock is aligned with the feedback clock by adjusting the output clock frequency until frequency/phase lock.

18 Claims, 9 Drawing Sheets

APPARATUS AND METHODS FOR DIGITAL PHASE LOCKED LOOP WITH ANALOG PROPORTIONAL CONTROL FUNCTION

CROSS REFERENCE TO RELATED APPLICATION

This application is a continuation of U.S. patent application Ser. No. 16/600,808, filed on Oct. 14, 2019, the entire content of which is incorporated by reference.

TECHNICAL FIELD

This disclosure relates to phase locked loops (PLLs). More specifically, this disclosure relates to a digital PLL with an analog proportional control function.

BACKGROUND

Phase locked loops (PLLs) are widely used in a variety of electronic applications and circuits including, but not limited to, telecommunications, computers, clock and data recovery circuits, frequency synthesizers, and analog-to-digital converts. PLLs may be implemented using analog components, digital components, and combinations thereof. Analog PLLs occupy large circuit areas, are susceptible to process, voltage and temperature variations, and have substantial power requirements as compared to digital PLLs. Digital PLLs, however, also suffer from certain disadvantages. For example, large loop gain factors are needed to guarantee loop stability and achieve high bandwidths in the digital PLL. Large loop gain factors, however, translate into high quantization noise and high jitter performance.

A technique for improving the performance of the digital PLLs is to use time to digital converters (TDC) as the phase detector. There are multiple drawbacks with using TDCs in digital PLLs. TDCs are very expensive in terms of power and area and performance of the PLL is limited by the resolution of the TDC. In addition, implementing the TDC in the digital PLL is complex. To achieve performance similar to analog PLLs, tens of femtoseconds of accuracy is required, which is very hard to achieve in advanced complementary metal-oxide-semiconductor (CMOS) technologies.

SUMMARY

Described herein are apparatus and methods for a digital phase locked loop (PLL) with an analog proportional control function. In an implementation, a digital phase locked loop includes a phase frequency detector (PFD) configured to output a pulse width modulated up pulse and a pulse width modulated down pulse based on comparison of a reference clock and a feedback clock, a digital integral path circuit connected to the PFD, the digital integral circuit configured to output a digital control signal based on the pulse width modulated up pulse and the pulse width modulated down pulse, and a controlled oscillator (CO) connected to the digital integral path circuit, an output of the PFD and an input of the PFD. The CO is configured to receive the pulse width modulated up pulse and the pulse width modulated down pulse from the PFD, and adjust a frequency of the CO based on the digital control signal, the pulse width modulated up pulse, and the pulse width modulated down pulse to generate an output clock, where the feedback clock is based on the output clock, and where the reference clock is aligned with the feedback clock by adjusting the frequency of the output clock until frequency and phase lock.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
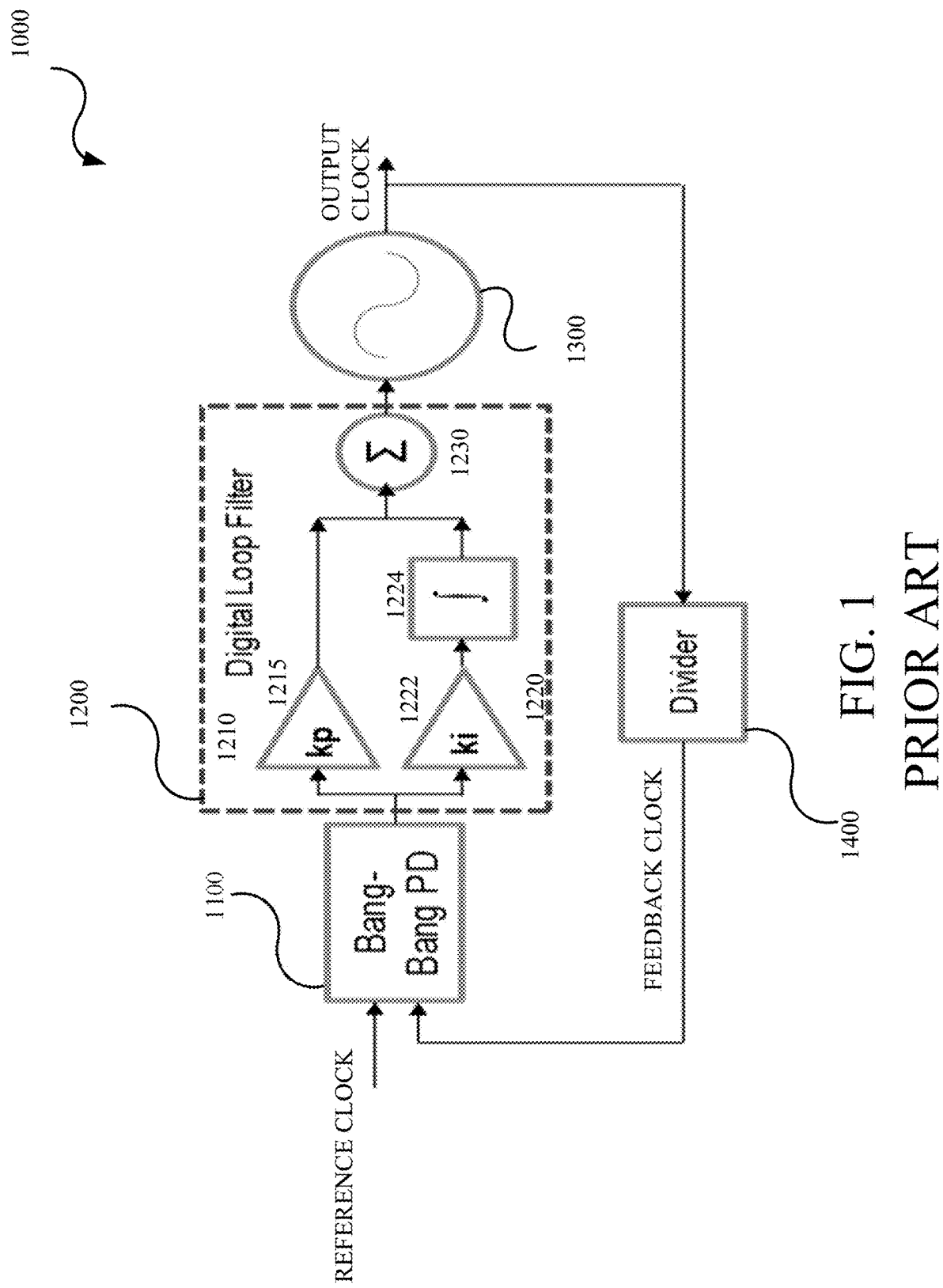
FIG. 1 is a block diagram of an example of a phase locked loop with a binary phase detector (BPD).

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

FIG. 1 is a block diagram of an example of a digital phase locked loop (PLL) 1000. The PLL 1000 includes a binary phase detector (BPD) 1100 (the BPD 1100 is also referred to as a bang-bang PD) which has an input connected to a reference clock and an output connected to a digital loop filter 1200. The digital loop filter 1200 includes a proportional path 1210 with a gain $K_p$ 1215 and an integral path 1220 with a gain $K_p$ 1222 and a filter 1224. The outputs of the proportional path 1210 and the integral path 1220 are summed or appropriately accumulated by a summer 1230 to provide an output of the digital loop filter 1200. The output of the digital loop filter 1200 is connected to a voltage-controlled oscillator (VCO) 1300. An output clock of the VCO 1300 is the output of the PLL 1000 and is also coupled back to the BPD 1100 as a feedback clock via a divider 1400. Those of ordinary skill may recognize that other elements may be desirable or necessary to implement the PLL described herein. However, because such elements are well known in the art, and because they do not facilitate a better understanding of the disclosed embodiments, a discussion of such elements may not be provided herein.

Operationally, the BPD 1100 outputs a "1" or a "0" depending on whether the feedback clock is leading or lagging with respect to the reference clock. The output of the BPD 1100 is filtered by the digital loop filter 1200 and applied to a control input of the VCO 1300 to produce the output clock that tracks the phase of the reference clock.

An advantage of digital PLLs over analog counterparts is that there is no charge-pump and hence the analog filter which occupies a large area is not required. However, there are multiple short-comings in the performance of the digital PLLs which use BPDs. One drawback is that a large Kp/Ki gain is required to guarantee the stability of the loop. Moreover, a large Kp/Ki is desired to achieve a high bandwidth in the PLL and hence to further filter the phase noise of the VCO. However, large Kp translates into high quantization noise in the VCO which in turn leads to high jitter performance at the output of the digital PLL. Large quantization noise results from large Kp because when the frequency and phase is acquired and locked the BPD always bangs between two states and this binary transition is multiplied by the Kp gain and modulates the frequency of the VCO. Hence, the large Kp translates into large frequency jumps and large quantization noise.

Figure 2A:
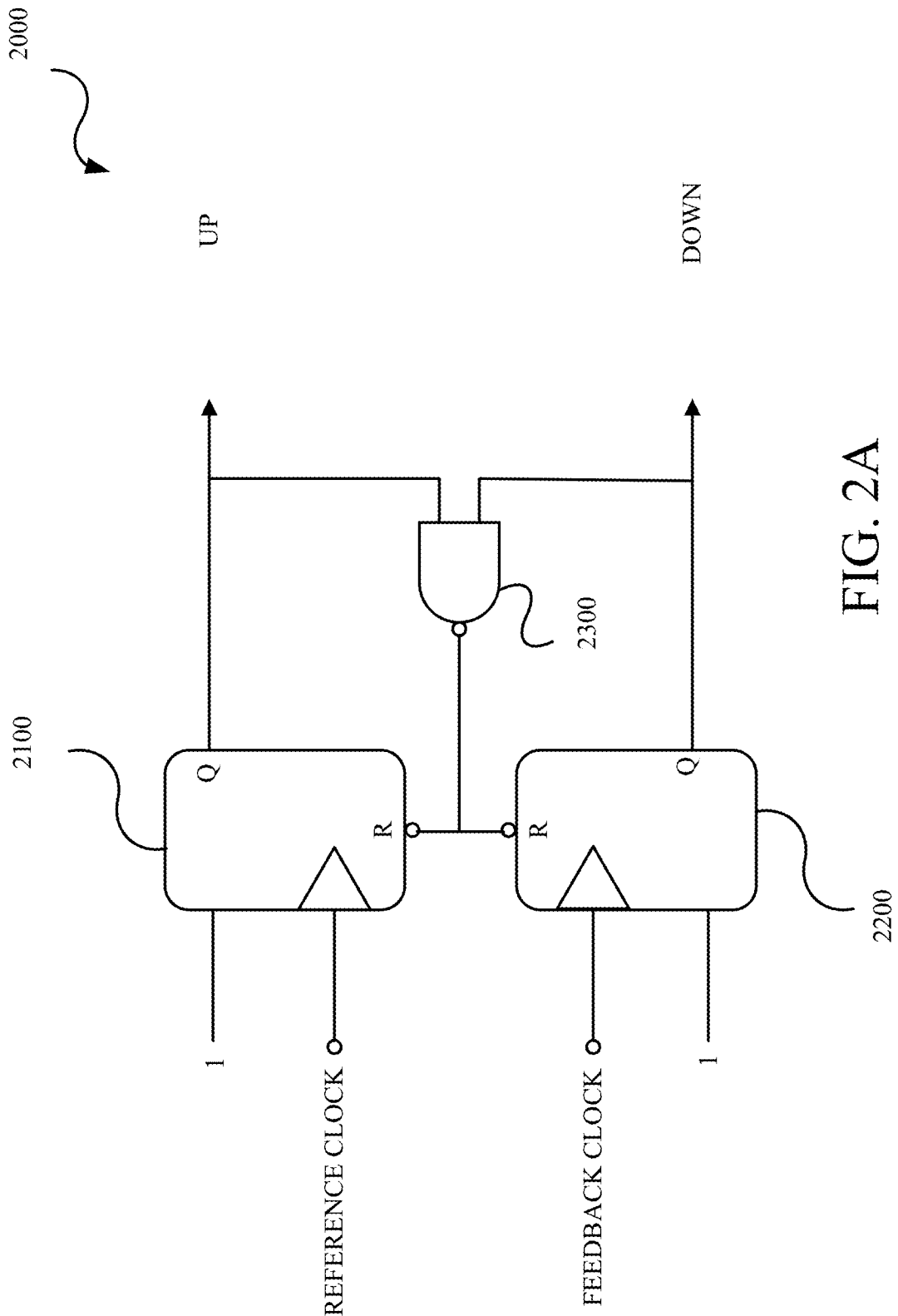
FIG. 2A is a block diagram of an example of a phase frequency detector (PFD).

FIG. 2A is a block diagram of an example of a phase frequency detector (PFD) 2000 of a PLL (not shown). The PFD 2000 can be implemented with all digital blocks and be placed and routed. The PFD 2000 includes a pair of D flip flops (DFFs) 2100 and 2200. The DFF 2100 has a data input tied to "1" and a clock input tied to a reference clock. The DFF 2200 has a data input tied to "1" and a clock input tied to a feedback clock. An output (Q) of the DFF 2100 and an output (Q) of the DFF 2200 are connected to, for example, a charge pump in the PLL (not shown) and connected to a NAND gate 2300. The presets (R) of the DFFs 2100 and 2200 are tied together and are connected to an output of the NAND gate 2300. Other PFD implementations may be used without departing from the scope of the claims and the specification. Those of ordinary skill may recognize that other elements may be desirable or necessary to implement the PLL described herein. However, because such elements are well known in the art, and because they do not facilitate a better understanding of the disclosed embodiments, a discussion of such elements may not be provided herein.

Figure 2B:
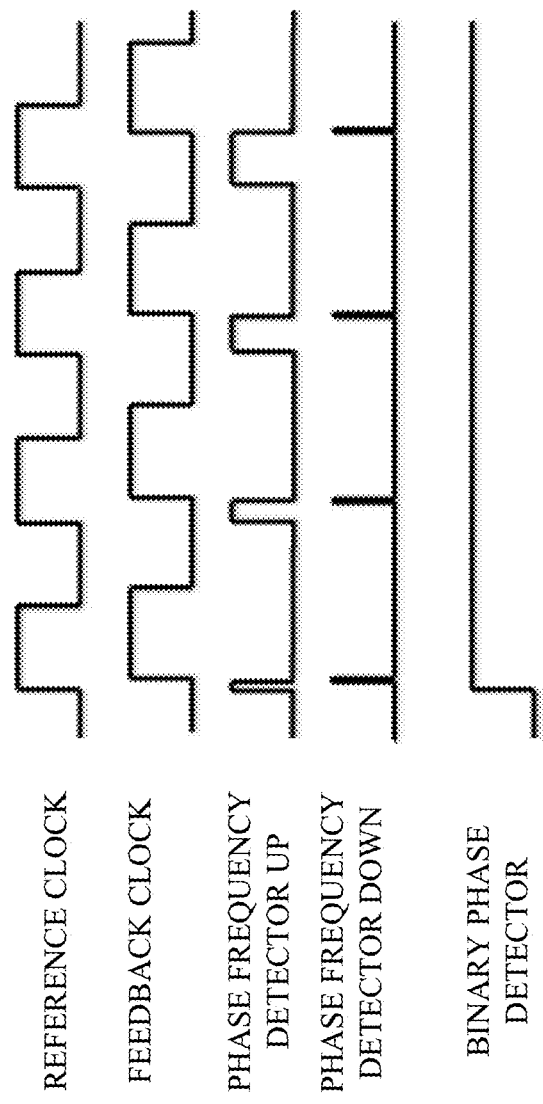
FIG. 2B is a timing diagram comparing clock relationships for a BPD and PFD in acquisition stage.
Figure 2C:
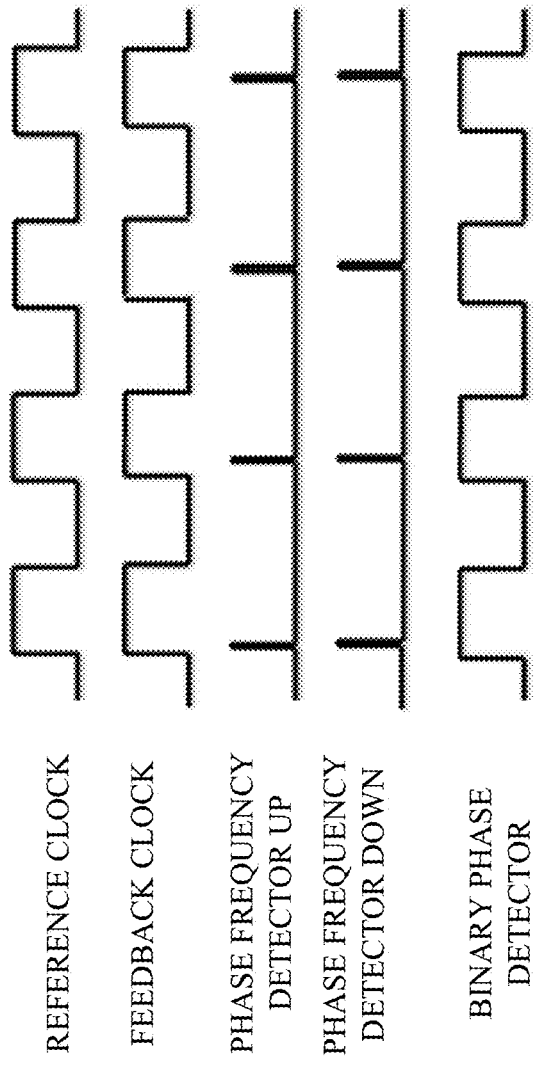
FIG. 2C is a timing diagram comparing clock relationships for a BPD and PFD in locked stage.

Type II PFD charge-pump based analog PLLs show a very smooth transition between an acquisition state and a lock state in contrast to BPDs. This is due to the PFD behavior where the width of the PFD output pulses (UP and DOWN pulses) is relative to the phase offset. In other words, the phase/frequency mismatch is encoded in the pulse width of the PFD output. FIG. 2B is a timing diagram comparing clock relationships for a BPD and PFD in acquisition stage and FIG. 2C is a timing diagram comparing clock relationships for a BPD and PFD in locked stage. As shown in in FIGS. 2B and 2C, the PFD pulse width varies based on the phase/frequency mismatch between the reference clock and the feedback clock. In the case of the BFD, the binary 0 or 1 output determines the phase/frequency mismatch. When the frequency is locked, and the phases are very close to each other, the pulse width at the PFD output shrinks relative to the phase mismatch and the BPD toggles between 0 and 1 output. This toggling is a source of high quantization noise.

Described herein are apparatus, device, and methods for a digital PLL with an analog proportional control function. In an implementation, the digital PLL uses a PFD as phase detector and applies the PFD outputs directly to a digitally controlled oscillator which leads to a low power, low jitter, low area and relatively simple PLL architecture. The high bandwidth with fine resolution enables this PLL to provide low jitter for integer-N digital clock generation and for fractional-N digital clock generation. The all-digital PLL achieves performance similar to that of analog PLLs without the requirement of charge-pumps and analog loop filters. All elements of the loop are digital friendly and can be realized using place-and-route or by using a field-programmable gate array (FPGA).

In an implementation, the PLL uses UP and DOWN pulses of the PFD directly as a proportional path of the loop and applies them straight to a digitally controlled oscillator which can transform the pulse width encoded information to frequency. The integral path is implemented digitally. Using a PFD as the phase detector and hence the pulse width encoded data to control the frequency of the oscillator allows for a fast proportional path which extends the bandwidth (fast acquisition) and reduces the quantization noise of the digital PLL as compared to a BFD based digital PLL. In an implementation, the digitally controlled oscillator tracks the pulse width of the PFD, adjusts the frequency accordingly, and provides complementary analog frequency tuning nobs to accommodate the complementary UP and DOWN pulses coming from the PFD. In an implementation, the digitally controlled oscillator's frequency is adjusted by the pulse width of the incoming control signals from PFD. In an implementation, a first set of switches and a second set of switches provide complementary frequency tuning characteristics. For example, a wider pulse on an UP signal, which is being fed to the first set of switches, increases the frequency while, a wider pulse on the DOWN signal, which is being fed to the second set of switches decreases the frequency.

The described architecture provides a high bandwidth loop with low quantization noise and low jitter performance.

Figure 3:
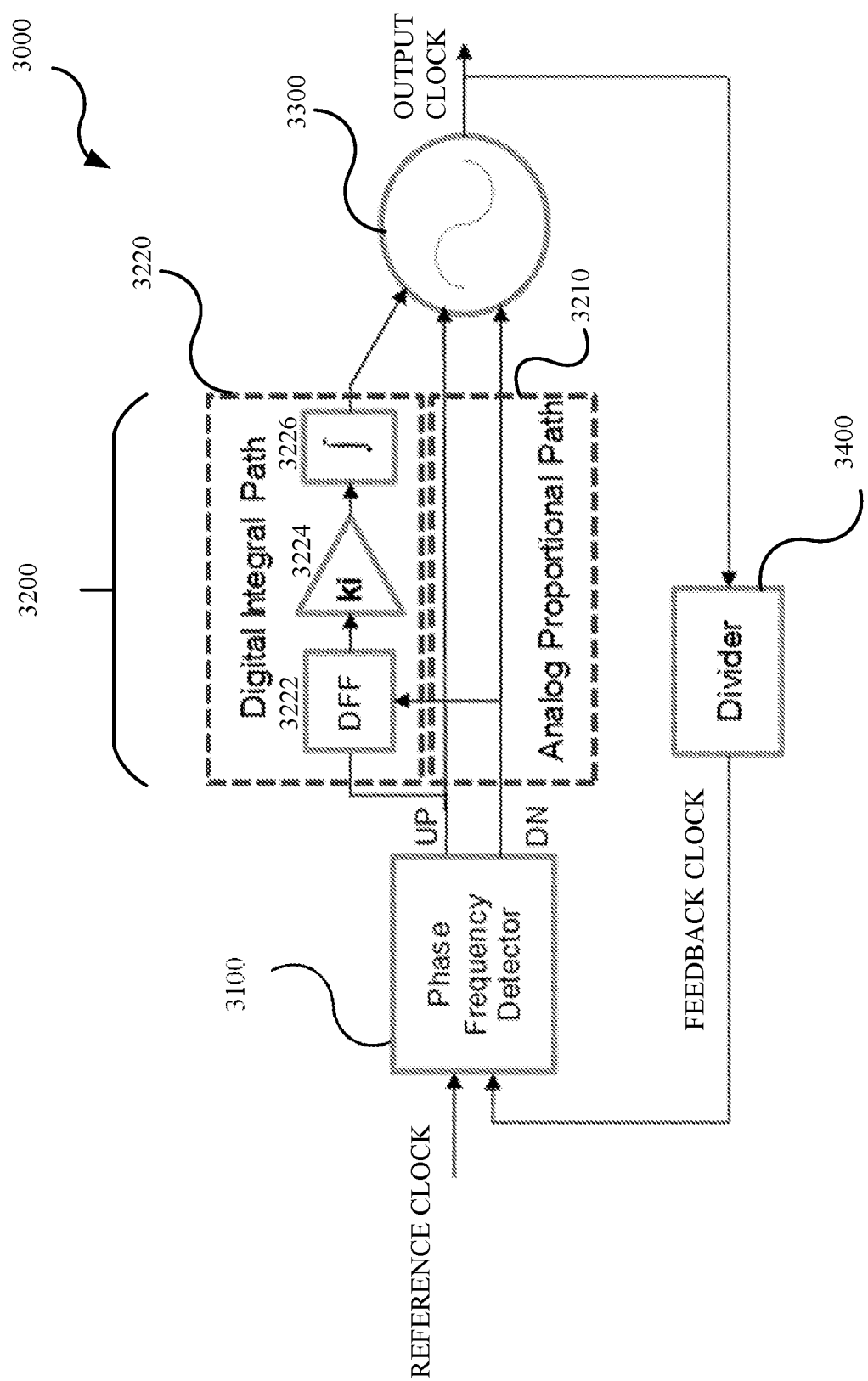
FIG. 3 is a block diagram of an example of a phase locked loop in accordance with embodiments of this disclosure.

FIG. 3 is a block diagram of an example of a PLL 3000 in accordance with embodiments of this disclosure. The PLL 3000 includes a PFD 3100 which has an input connected to a reference clock and an output connected to a digital loop filter 3200. The digital loop filter 3200 includes a proportional path 3210 and a digital integral path 3220. The digital integral path 3220 includes a DFF 3222 connected to a gain $K_p$ component 3224, which in turn is connected to a filter 3226.

With respect to the digital integral path 3220, UP and DOWN pulses from the PFD 3100 are connected to the DFF 3222 and the output from the filter 3226 is connected to a controlled oscillator (CO) 3300. The CO 3300 tracks the pulse width of the PFD 3100 and tunes the frequency in accordance with the UP and DOWN pulses. In an implementation, the CO 3300 is a voltage-controlled oscillator. In an implementation, the CO 3300 is a current-controlled oscillator. In an implementation, the CO 3300 is a digital controlled oscillator.

With respect to the proportional path 3210, the UP and DOWN pulses from the PFD 3100 are connected to the CO 3300. That is, the proportional path gain is the pulse width of the PFD output, i.e., the UP and DOWN pulses. The UP and DOWN pulses are perceived as analog outputs and direct connection of the UP and DOWN pulses to the CO 3300 perform as an analog function in that the pulse width of the UP and DOWN pulses are directly proportional to the phase difference between a reference clock and a feedback clock. As such, a charge pump and bulky loop filter are not required as in analog PLLs.

An output clock of the CO 3300 is the output of the PLL 3000 and is also coupled back to the PFD 3100 as a feedback clock via a divider 3400. In an implementation, the PFD 3100, the digital loop filter 3200, and the divider 3400 are digital blocks that can be placed and routed. Those of ordinary skill may recognize that other elements may be desirable or necessary to implement the PLL described herein. However, because such elements are well known in the art, and because they do not facilitate a better understanding of the disclosed embodiments, a discussion of such elements may not be provided herein.

Operationally, the PFD 3100 detects the phase and frequency differences between the reference clock and the feedback clock and generates UP and DOWN pulses. The UP and DOWN pulses are processed by the digital integral path 3220 and the output of the digital integral path 3220 in addition to the directly connected UP and DOWN pulses control the CO 3300. In particular, the CO 3300 adjusts the frequency by increasing (integrating up or positive accumulation) or decreasing (integrating down or negative accumulation) the frequency depending on the values of the UP and DOWN pulses and generates the output clock. The output clock is divided by the divider 3400 to generate the feedback clock.

Figure 4:
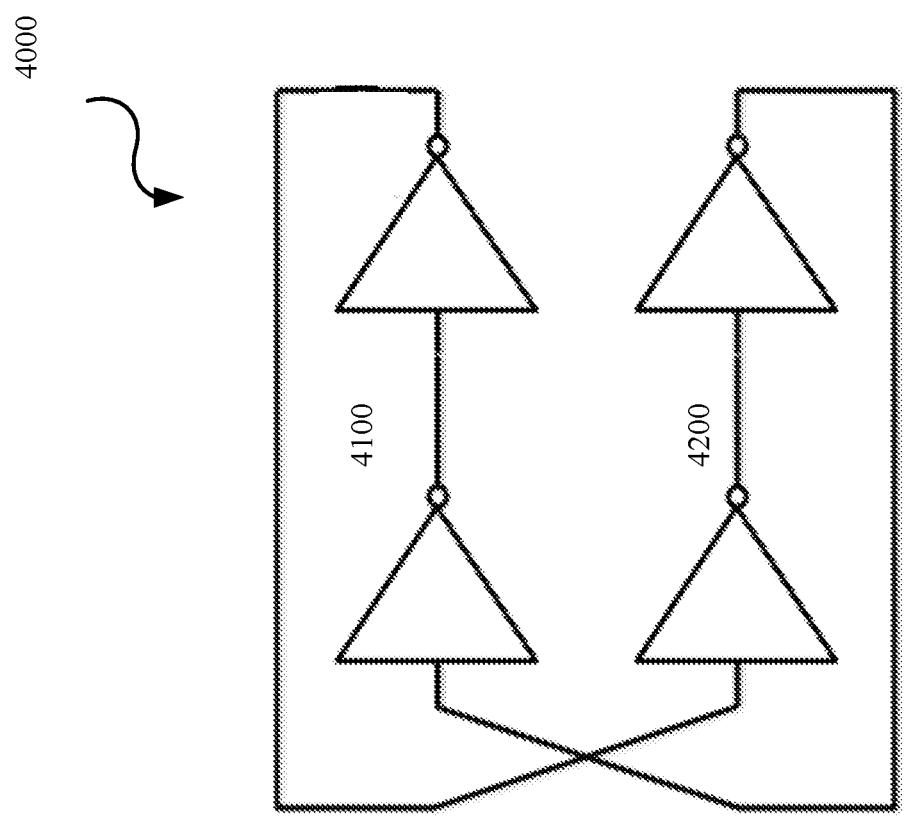
FIG. 4 is a block diagram of an example of a digitally controlled voltage-controlled oscillator in a phase locked loop in accordance with embodiments of this disclosure.

FIG. 4 is a block diagram of an example of a digitally controlled VCO 4000 in a phase locked loop in accordance with embodiments of this disclosure. The VCO 4000 is a ring oscillator circuit which includes a first pair of coupled inverters 4100 and a second set of coupled inverters 4200. An output of the first pair of coupled inverters 4100 is connected to an input of the second set of coupled inverters 4200 and an output of the second pair of coupled inverters 4200 is connected to an input of the first set of coupled inverters 4100 to form the ring oscillator circuit.

Figure 5:
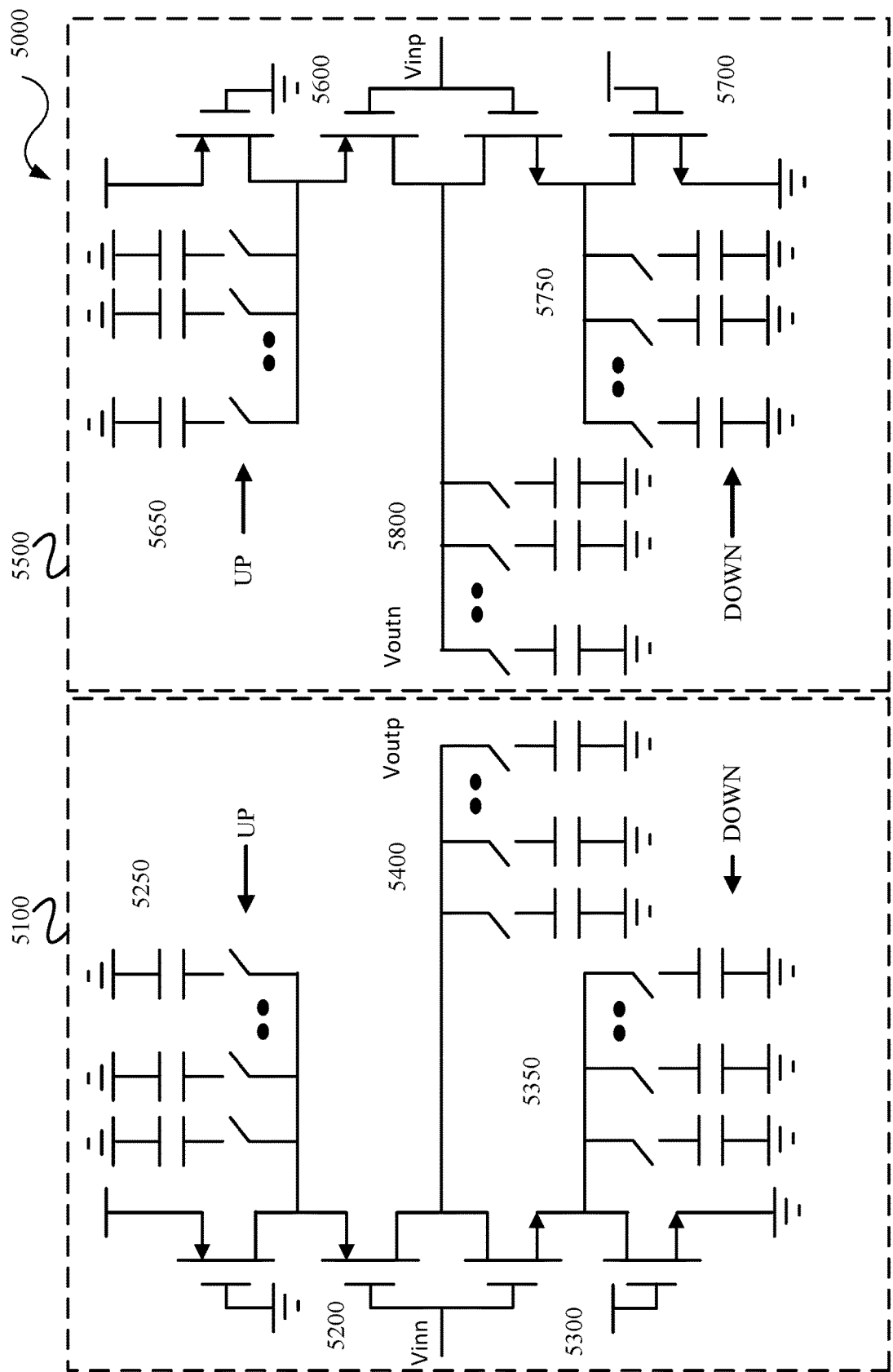
FIG. 5 is a block diagram of an example implementation of the digitally controlled VCO of FIG. 4 in accordance with embodiments of this disclosure.

FIG. 5 is a block diagram of an example circuit 5000 of the digitally controlled VCO 4000 of FIG. 4 in accordance with embodiments of this disclosure. The digitally controlled VCO 4000 may be implemented as described in U.S. Pat. No. 10,320,374 issued to Parvizi et al. on Jun. 11, 2019, which is incorporated herein by reference in its entirety, where the effective transconductance ($g_m$) of the delay cells are controlled through switched capacitors connected to of P-type metal-oxide-semiconductor (PMOS) transistors and of N-type metal-oxide-semiconductor (NMOS) transistors pairs. This VCO architecture enables the implementation of a relatively simple digital PLL which provides high bandwidth with low jitter without a charge-pump. In an implementation, the circuit 5000 can be used to implement fractional PLLs with multi-modulus dividers, for example. The circuit 5000 enables adjusting the frequency in response to complementary UP and DOWN pulses as described herein. The circuit 5000 is illustrative and other circuits can be used without departing from the scope of the specification and/or claims.

The circuit 5000 is in a differential circuit configuration which includes a first terminal 5100 and a second terminal 5500. The first terminal 5100 includes a first pair of PMOS transistors 5200 connected to a first bank of switched capacitors 5250 and a first pair of NMOS transistors 5300 connected to a second bank of switched capacitors 5350, where a first terminal input voltage (Vinn) is tied to the first pair of PMOS transistors 5200 and the first pair of NMOS transistors 5300 and a first terminal output voltage (Voutp) is tied to the first pair of PMOS transistors 5200, the first pair of NMOS transistors 5300, and a third bank of switched capacitors 5400. The second terminal 5500 includes a second pair of PMOS transistors 5600 connected to a fourth bank of switched capacitors 5650 and a second pair of NMOS transistors 5700 connected to a fifth bank of switched capacitors 5750, where a second terminal input voltage (Vinp) is tied to the second pair of PMOS transistors 5600 and the second pair of NMOS transistors 5700 and a second terminal output voltage (Voutn) is tied to the second pair of PMOS transistors 5600, the second pair of NMOS transistors 5700, and a sixth bank of switched capacitors 5800.

Operationally, the first bank of switched capacitors 5250 and the fourth bank of switched capacitors 5650 are tied (directly from the PFD and via a digital integral path (not shown)) to an UP pulse of a PFD and the second bank of switched capacitors 5350 and the fifth bank of switched capacitors 5750 are tied (directly from the PFD and via a digital integral path (not shown)) to a DOWN pulse of the PFD. The first bank of switched capacitors 5250, the fourth bank of switched capacitors 5650, the second bank of switched capacitors 5350, and the fifth bank of switched capacitors 5750 provide fine control for the VCO as described herein. Each of the first bank of switched capacitors 5250, the fourth bank of switched capacitors 5650, the second bank of switched capacitors 5350, and the fifth bank of switched capacitors 5750 are proportioned between an integral path and a proportional path as shown, for example, in FIG. 6. In an implementation, the integral path is allocated a sufficient number of switched capacitors to cover the relevant frequency range. In an implementation, the proportional path is allocated a sufficient number of switched capacitors to provide VCO corrections. The third bank of switched capacitors 5400 and the sixth third bank of switched capacitors 5800 are tied to a controller (shown in FIG. 6). The controller, for example, provides process control or adjustment for the VCO. In an implementation, the controller can provide coarse control. In an implementation, the controller can tune to an applicable frequency band or range.

The appropriate switched capacitors are switched on depending on the pulse width of the PFD output. This enables modulation of the frequency for the amount of time that the UP or DOWN pulse is active. The longer the pulse width, the larger the frequency modulation. Once the frequency and the phase are locked, PFD will generate narrow UP and DOWN pulses (relative to the pulses generated during acquisition) which are symmetrical and applied to the VCO symmetrically. Once there is a symmetrical pulse applied to the switched capacitors tied to the PMOS and NMOS transistors, cancellation occurs and no frequency/phase modulation happens. This minimizes the quantization noise of the PLL. Moreover, complementary control is achieved by the switched capacitors connected to both the PMOS and NMOS transistors. This controlling of the frequency through the switched capacitors (which modulates the transconductance) can be applied to a LC based VCO with an inverter as a transconductance cell.

Figure 6:
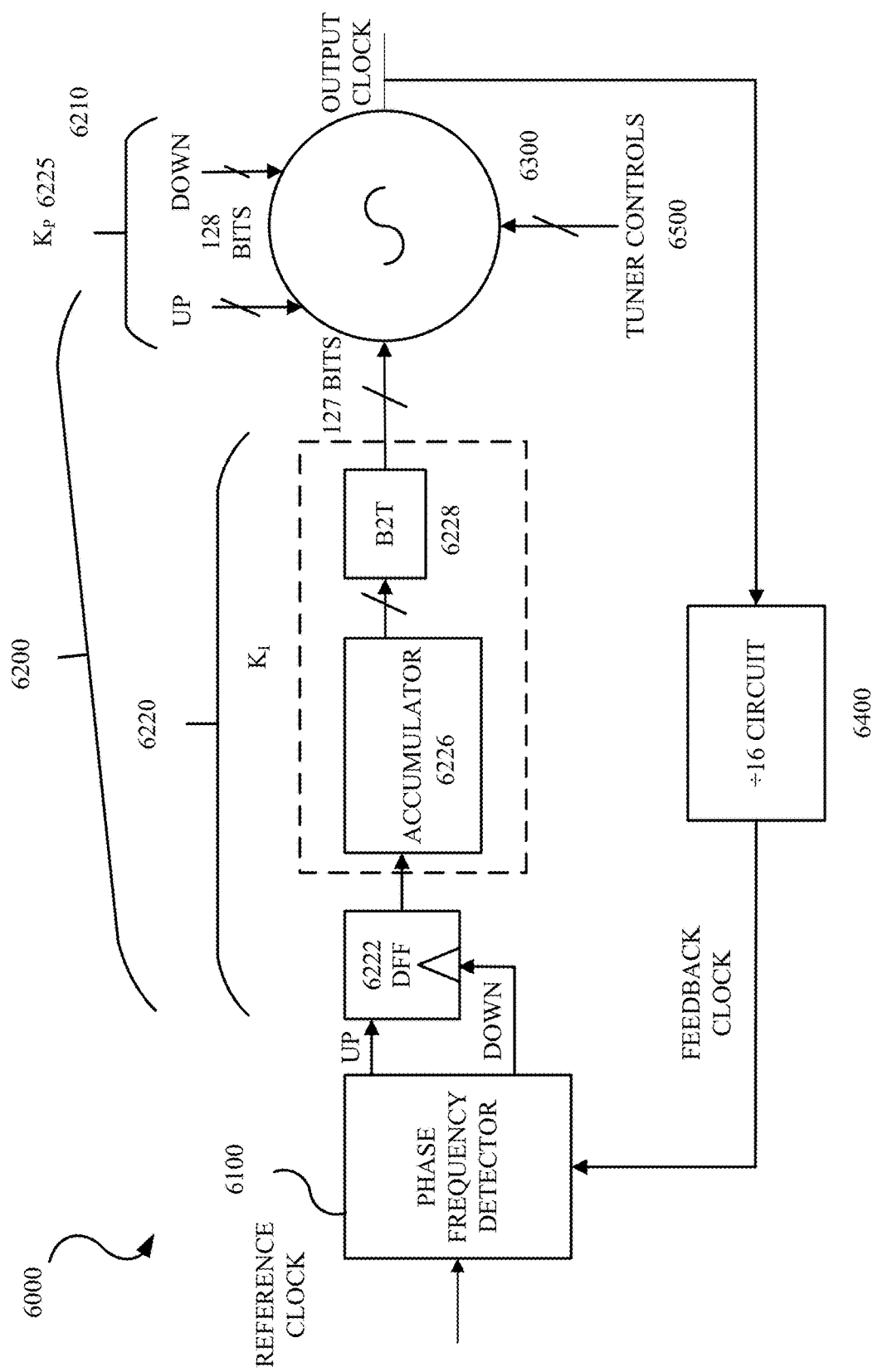
FIG. 6 is a block diagram of an example of a phase locked loop in accordance with embodiments of this disclosure.

FIG. 6 is a block diagram of an example of a PLL 6000 in accordance with embodiments of this disclosure. The PLL 6000 includes a PFD 6100 which has an input connected to a reference clock and an output connected to a digital loop filter 6200. The digital loop filter 6200 includes a proportional path 6210 and a digital integral path 6220. The digital integral path 6220 includes a DFF 6222 connected to a gain $K_p$ component 6225, which includes an accumulator 6226 connected to a binary-to-thermometer (B2T) converter 6228. In an implementation, the B2T converter 6228 converts the output of the accumulator 6226 to a thermometer code output which is a code where one bit changes at a time (e.g., in a cycle). In this fashion, the PLL 6000 may adjust frequency incrementally in a step-wise fashion to reach frequency and phase lock.

With respect to the digital integral path 6220, UP and DOWN pulses from the PFD 3100 are input to the DFF 6222 and the output from the B2T 6228 is connected to a controlled oscillator (CO) 6300. The CO 6300 tracks the pulse width of the PFD 6100 and tunes the frequency in accordance with the UP and DOWN pulses. In an implementation, the CO 6300 is a VCO. In an implementation, the CO 6300 is a current-controlled oscillator. In an implementation, the CO 6300 is a digital controlled oscillator. In an implementation, the accumulator 6226 is an 8 bit device, where 127 bits are allocated to the digital integral path 6220 and 128 bits are allocated to the proportional path 6210. For this implementation, when the CO 6300 is realized as described in FIGS. 4 and 5, the switched capacitors are also allocated accordingly.

With respect to the proportional path 6210, the UP and DOWN pulses from the PFD 6100 are inputs to the CO 6300. The UP and DOWN pulses are perceived as analog outputs and direct connection of the UP and DOWN pulses to the CO 6300 perform as an analog function in that the pulse width of the UP and DOWN pulses are directly proportional to the phase difference between a reference clock and a feedback clock and the proportional path gain is the pulse width of the UP and DOWN pulses.

An output clock of the CO 6300 is the output of the PLL 6000 and is also coupled back to the PFD 6100 as a feedback clock via a divide by 16 divider 6400. In an implementation, the PFD 6100, the digital loop filter 6200, and the divider 6400 are digital blocks that can be placed and routed. Those of ordinary skill may recognize that other elements may be desirable or necessary to implement the PLL described herein. However, because such elements are well known in the art, and because they do not facilitate a better understanding of the disclosed embodiments, a discussion of such elements may not be provided herein.

Operationally, the PFD 6100 detects the phase and frequency differences between the reference clock and the feedback clock and generates the UP and DOWN pulses. The UP and DOWN pulses are processed by the digital integral path 6220 to generate a positive or negative control word which is applied to the CO 6300 along with direct application of the UP and DOWN pulses. The CO 6300 increases or decreases the frequency depending on whether the UP or DOWN pulse is high or "1". The output clock is divided by the divide by 16 divider 6400 to generate the feedback clock. In an implementation, the CO 6300 is tuned to the frequency band using tuner controls 6500. This adjusts the CO frequency to the frequency range or band of operation and then the loop operation synchronizes to the frequency of operation.

Figure 7:
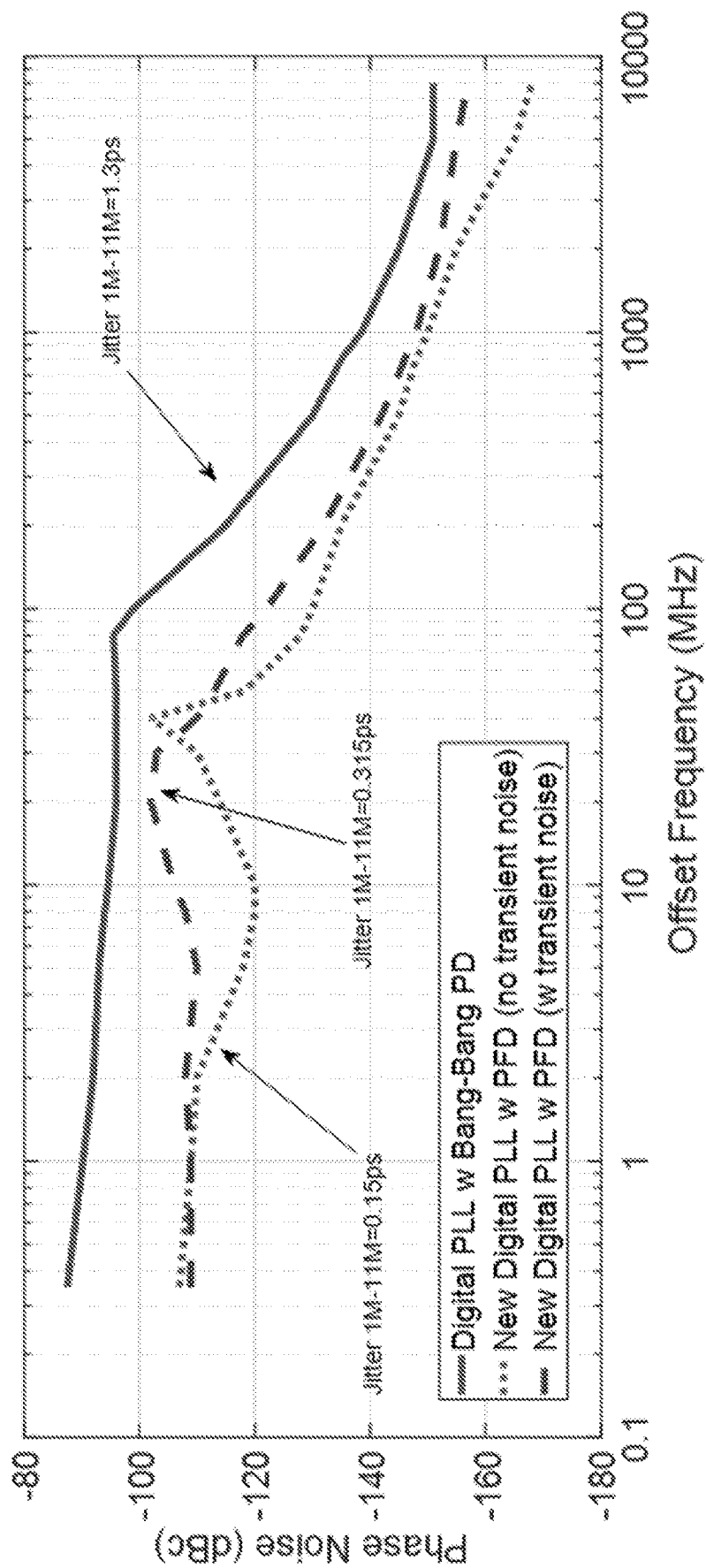
FIG. 7 is a graph comparing transient noise simulation of a conventional digital phase locked loop with quantization noise contribution in a transient simulation of a phase locked loop in accordance with embodiments of this disclosure and transient noise simulation of a phase locked loop in accordance with embodiments of this disclosure.

FIG. 7 is a graph comparing transient noise simulation of a conventional digital PLL with a graph of quantization noise contribution in a transient simulation of a digital PLL in accordance with embodiments of this disclosure and transient noise simulation of a digital PLL in accordance with embodiments of this disclosure. In particular, FIG. 7 shows the transient noise-based phase noise response of the BFD based PLL shown in FIG. 1 The PLL is operating at around 9 GHz. The phase noise at 1 MHz is highlighted to be around −90 dBc/Hz and the jitter from 1 MHz to 11 MHz is around 1.3 ps. The high phase noise at 1 MHz is mostly due to quantization noise contribution of the PLL. The BFD based PLL is compared with a graph of quantization noise contribution in a transient simulation of a digital PLL in accordance with embodiments of this disclosure (the dotted line graph). Here, the transient noise is not enabled so that only the quantization noise contribution of the PLL is observed. As shown in the graph, the phase noise at 1 MHz drops to −110 dBc/Hz and the jitter is around 150 fs. This is a significant improvement in the phase noise of the digital PLL as the jitter drops from 1.3 ps to 150 fs. The BFD based PLL is compared with a graph where the transient noise is enabled (the dashed lines). As shown in the graph, the phase noise at 1 MHz is still around −110 dBc/Hz and the jitter from 1 M-11 MHz is reduced to 315 fs. This is still a significant improvement in the phase noise of the digital PLL as the jitter drops from 1.3 ps to 315 fs.

Figure 8:
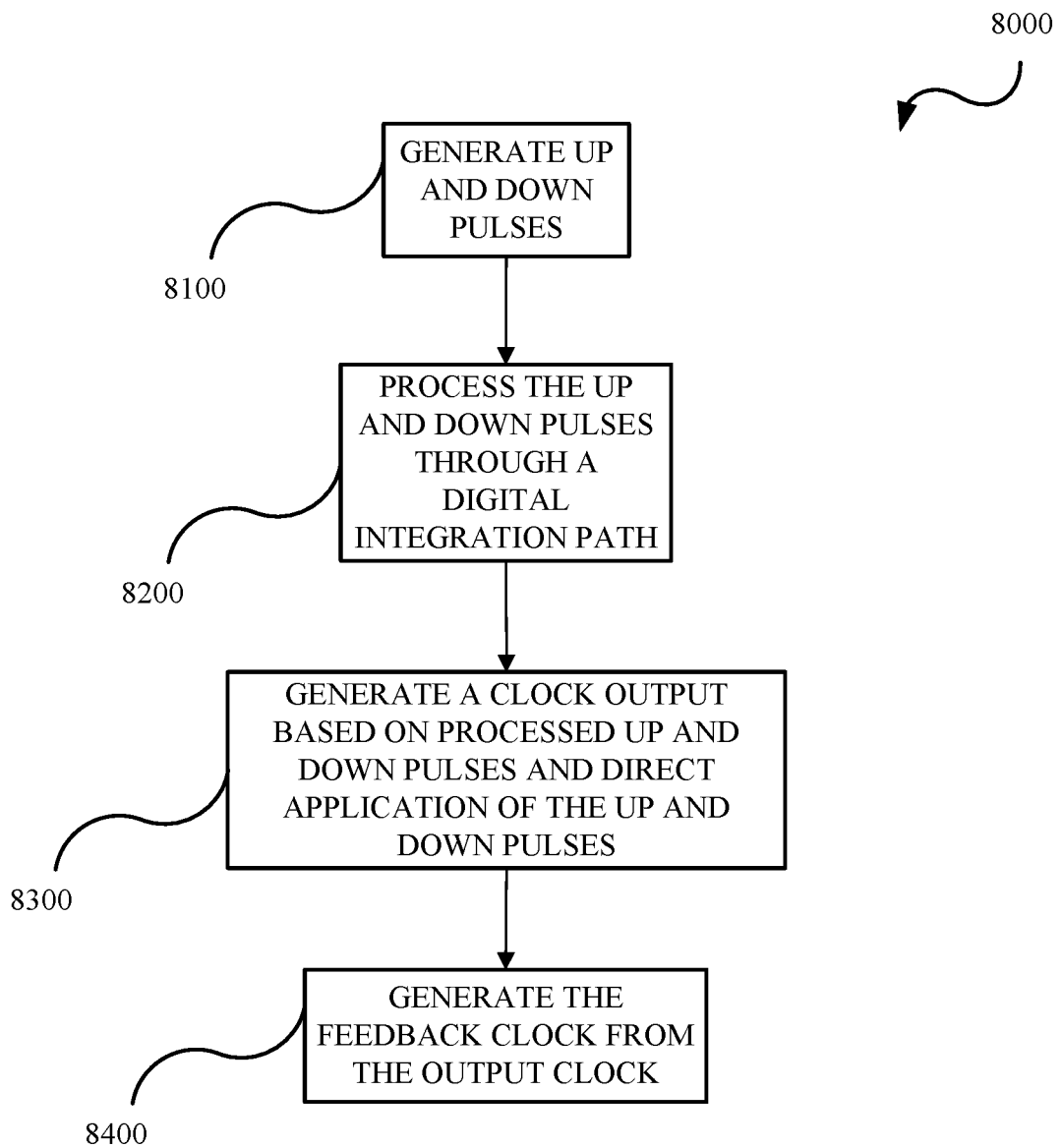
FIG. 8 is a flowchart of an example technique for a digital phase locked loop with an analog proportional control function in accordance with embodiments of this disclosure.

FIG. 8 is a flowchart of an example method 8000 for a digital phase locked loop with an analog proportional control function in accordance with embodiments of this disclosure. The method 8000 includes: generating 8100 UP and DOWN pulses from detected phase and frequency differences between a reference clock and a feedback clock; processing 8200 the UP and DOWN pulses through a digital integration path; generating 8300 a clock output based on processed UP and DOWN pulses and direct application of the UP and DOWN pulses; and generating 8400 the feedback clock from the output clock. The method 10000 may be implemented, as appropriate and applicable, by the digital PLL 3000 of FIG. 3, the VCO 4000 of FIG. 4, the circuit 5000 of FIG. 5, and the PLL 6000 of FIG. 6.

The method 800 includes generating 8100 UP and DOWN pulses from detected phase and frequency differences between a reference clock and a feedback clock. In an implementation, a PFD detects phase and frequency differences between a reference clock and a feedback clock and generates output pulses (the UP and DOWN pulses) where the width of the pulse is relative to the phase difference. Upon PLL locking, the pulse width is minimal and jitter is minimized.

The method 8000 includes processing 8200 the UP and DOWN pulses through a digital integration path. In an implementation, the digital integration path processes the UP and DOWN pulses to generate a control word. In an implementation, the digital integration path of a loop filter processes the UP and DOWN pulses via a DFF and a gain filter or component. In an implementation, the digital integration path processes the UP and DOWN pulses via a DFF, accumulator and a B2T.

The method 8000 includes generating 8300 a clock output based on processed UP and DOWN pulses and direct application of the UP and DOWN pulses. As described herein, the loop filter includes the digital integration path and a proportional path. The proportional path in this instance is implemented by directly connecting the output of the PFD to the CO and the gain for the proportional path is the pulse width of the UP and DOWN pulses. In an implementation, the digital integration path and the proportional path are allocated an appropriate number of bits relative to application to the CO. In an implementation, the CO is adjusted on a coarse basis using a tuner. For example, the CO is adjusted to a frequency range or band and then the loop fine adjusts to the frequency of operation.

The method 8000 includes generating 8400 the feedback clock from the output clock. A divider divides the output clock to generate the feedback clock.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A digital phase locked loop comprising:
   a digital integral path circuit configured to generate a digital control signal using a first pulse and a second pulse generated by a phase frequency detector (PFD) from a reference clock and a feedback clock difference, the digital integral path circuit including at least an accumulator connected to a binary-to-thermometer (B2T) converter; and
   a controlled oscillator (CO) connected to at least the digital integral path circuit, the CO configured to:
      receive the first pulse and the second pulse from the PFD; and
      generate an output clock by frequency adjustment of the CO based on the digital control signal, the first pulse, and the second pulse, the feedback clock related to the output clock,
   wherein the B2T converter converts the output of the accumulator to a thermometer code output which is a code where one bit changes at a time and enables the CO to adjust the frequency incrementally in a step-wise fashion until alignment of the reference clock with the feedback clock.

2. The digital phase locked loop of claim 1, wherein a proportional path of the digital phase locked loop is implemented by direct connection of the output of the PFD with an input of the CO.

3. The digital phase locked loop of claim 1, wherein the CO is a digitally controlled voltage CO.

4. The digital phase locked loop of claim 3, wherein the digitally controlled voltage CO comprising:
   a first terminal including a first pair of first type transistors connected to a first bank of switched capacitors and a first pair of second type transistors connected to a second bank of switched capacitors; and
   a second terminal including a second pair of first type transistors connected to a third bank of switched capacitors and a second pair of second type transistors connected to a fourth bank of switched capacitors,
   wherein the first bank of switched capacitors and the third bank of switched capacitors are tied to the first pulse and the control signal, and
   wherein the second bank of switched capacitors and the fourth bank of switched capacitors are tied to the second pulse and the control signal.

5. The digital phase locked loop of claim 4, wherein the first bank of switched capacitors, the third bank of switched capacitors, the second bank of switched capacitors, and the fourth bank of switched capacitors provide fine level control of the digitally controlled voltage CO.

6. The digital phase locked loop of claim 4, wherein each of the first bank of switched capacitors, the third bank of switched capacitors, the second bank of switched capacitors, and the fourth bank of switched capacitors are proportioned between the digital integral path circuit and a proportional path, wherein the proportional path is implemented by direct connection of the output of the PFD with an input of the digitally controlled voltage CO.

7. The digital phase locked loop of claim 6, wherein the integral path is allocated a sufficient number of switched capacitors to cover a relevant frequency range.

8. The digital phase locked loop of claim 6, wherein the proportional path is allocated a sufficient number of switched capacitors to provide digitally controlled voltage CO corrections.

9. The digital phase locked loop of claim 4, wherein a fifth bank of switched capacitors and a sixth bank of switched capacitors provide coarse control of the digitally controlled voltage CO.

10. The digital phase locked loop of claim 4, wherein a fifth bank of switched capacitors and a sixth third bank of switched capacitors are tied to a controller to tune the digitally controlled voltage CO to an applicable frequency band or range.

11. A phase locked loop comprising:
a phase frequency detector (PFD) configured to generate a pair of complementary signals based on a variation between a reference clock and an N divided output clock; and
a controlled oscillator (CO) connected to the PFD, the CO configured to generate an output clock by adjusting a frequency of the CO based on the pair of complementary signals and a digital control signal which is generated from at least the pair of complementary signals, the CO including a terminal and a complementary terminal, each of the terminal and a complementary terminal including one set of first type transistors connected to a first bank of switched capacitors and one set of second type transistors connected to a second bank of switched capacitors, wherein each of the first bank of switched capacitors is tied to one of the pair of complementary signals and the control signal, and wherein each of the second bank of switched capacitors is tied to another of the pair of complementary signals and the control signal,
wherein lock between the reference clock and the N divided output clock being attained by adjusting the frequency of the output clock.

12. The phase locked loop of claim 11, wherein direct connection of an output of the PFD with an input of the CO implements a proportional path and the digital control signal is received from a digital integral path device.

13. The phase locked loop of claim 11, wherein each of the first bank of switched capacitors and the second bank of switched capacitors provide fine level control of the CO.

14. The phase locked loop of claim 11, wherein each of the first bank of switched capacitors, and the second bank of switched capacitors are proportioned to receive the digital control signal, the one of the pair of complementary signals, and the another of the pair of complementary signals.

15. The phase locked loop of claim 14, wherein allocation is implemented to provide coverage of a relevant frequency range and to provide CO corrections.

16. A method, the method comprising:
directly receiving, at a controlled oscillator (CO), a first pulse and a second pulse generated by a phase frequency detector from a reference clock and a feedback clock difference; and
generating an output clock by frequency adjustment of the CO based on the first pulse, the second pulse, and a control signal which is at least based on the first pulse and the second pulse and is a thermometer code where one bit changes at a time to enable incremental frequency adjustment,
wherein the incremental frequency adjustment continues in a step-wise fashion until alignment of the reference clock with the feedback clock.

17. The method of claim 16, wherein a proportional path of the phase locked loop is implemented by direct connection of the output of the PFD with an input of the CO.

18. The method of claim 16, further comprising:
dividing the output clock to generate the feedback clock.

* * * * *